United States Patent [19]

Phillips

[11] Patent Number: 4,704,027

[45] Date of Patent: Nov. 3, 1987

[54] DARK FIELD ALIGNMENT AND ALIGNMENT MARK SYSTEMS

[75] Inventor: Edward H. Phillips, Middletown, Calif.

[73] Assignee: Compact Spindle Bearing Corporation, Middletown, Calif.

[21] Appl. No.: 876,233

[22] Filed: Jun. 19, 1986

[51] Int. Cl.[4] .................. G03B 27/52; G03B 27/70
[52] U.S. Cl. .................................. 355/43; 355/45; 355/53
[58] Field of Search ..................... 355/43, 45, 53

[56] References Cited

U.S. PATENT DOCUMENTS

| | | | |
|---|---|---|---|
| 3,853,398 | 12/1974 | Kano | 355/43 |
| 4,367,046 | 1/1983 | Lacombat | 355/53 X |
| 4,395,117 | 7/1983 | Suzuki | 355/43 |
| 4,422,755 | 12/1983 | Phillips | 355/43 |
| 4,452,526 | 6/1984 | Johannsmeier et al. | 355/43 |

Primary Examiner—Richard A. Wintercorn
Attorney, Agent, or Firm—Limbach, Limbach & Sutton

[57] ABSTRACT

A dark field alignment system is provided wherein a bifurcated light source, including a secondary channel having spot sources of light located in a plane conjugate to the object plane of a reduction lens and directed through a peripheral ring of a plane conjugate to the apertgure plane of the reduction lens, illuminates the object plane of the reduction lens. Reflected and defracted light from an alignment mark of a semiconductive wafer in the image plane of the reduction lens is captured by a mirror located near the aperture plane of the reduction lens. This light is refocused to another plane conjugate to the object plane of the reduction lens and imaged onto detector arrays to provide alignment information. Also provided is an alignment mark system wherein the relative positions of alignment windows in an array of alignment windows, and alignment patterns in a corresponding array of alignment patterns are selected such that an image of an edge of each reticle alignment window illuminates a first edge of a counterpart alignment mark without illuminating any other edges of the alignment marks when the marks and windows are properly aligned.

7 Claims, 15 Drawing Figures

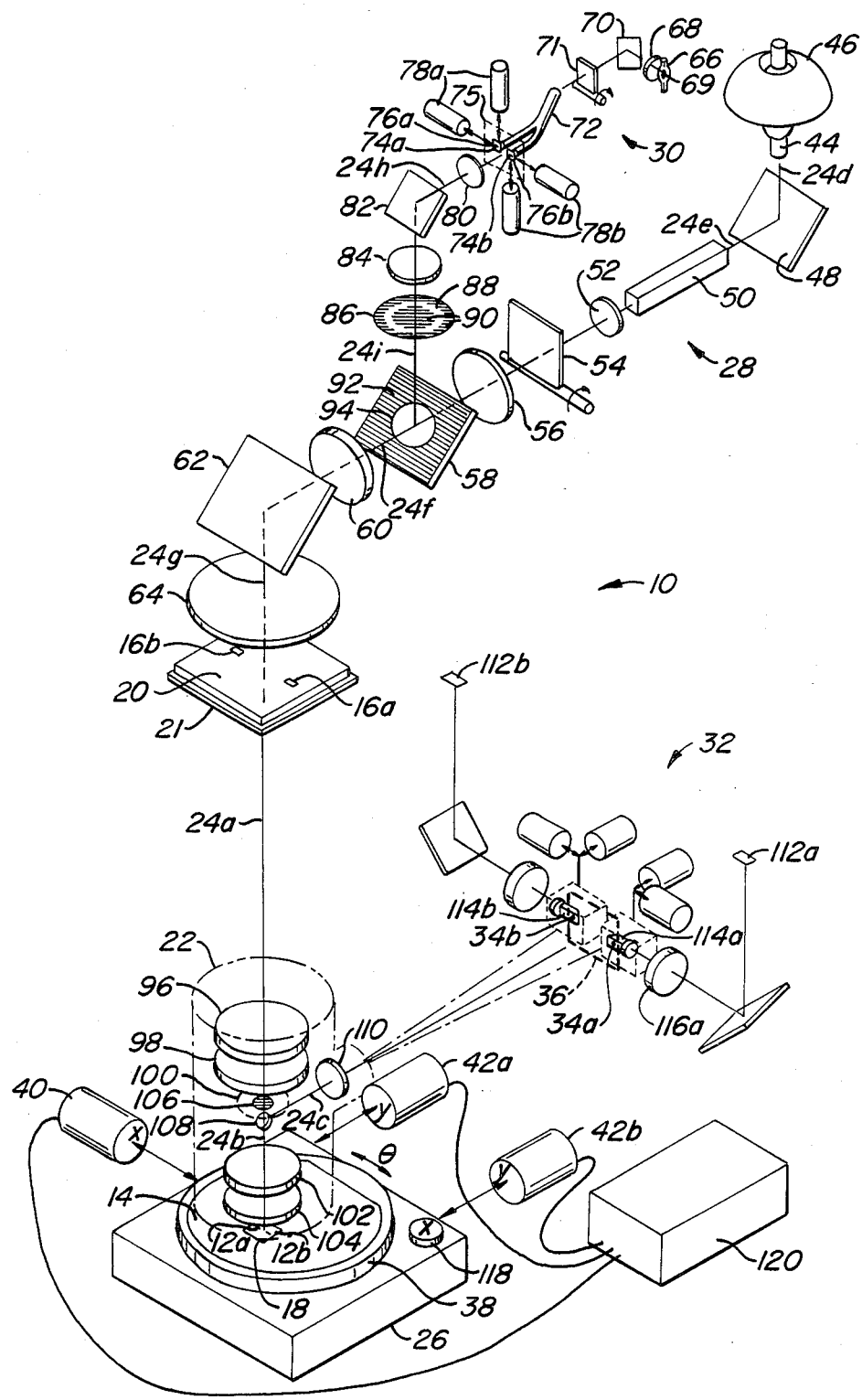
FIG._1.

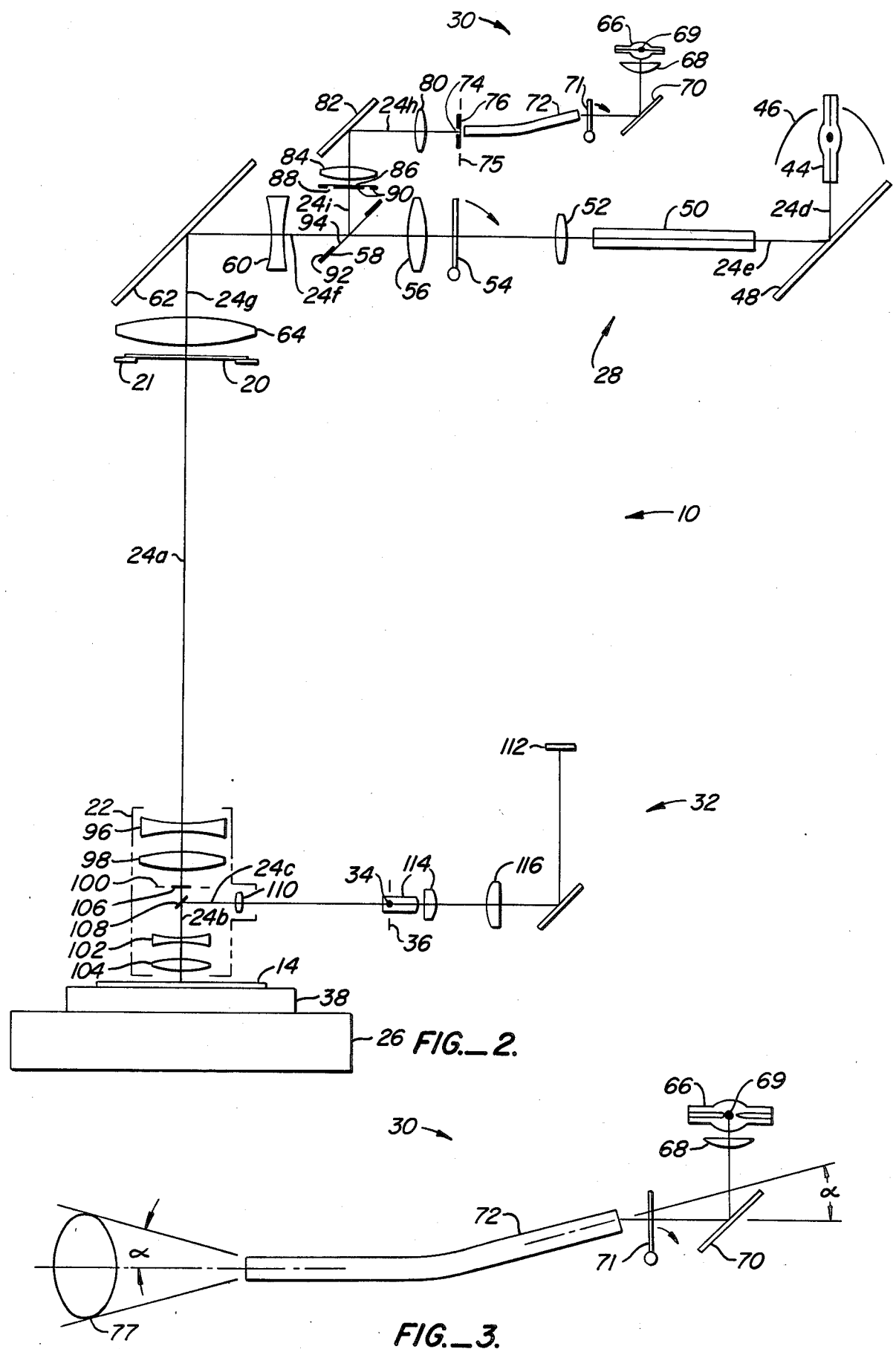

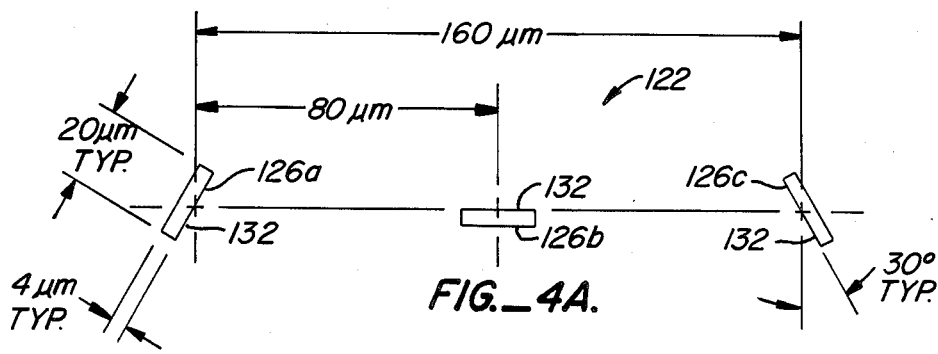
FIG._4A.
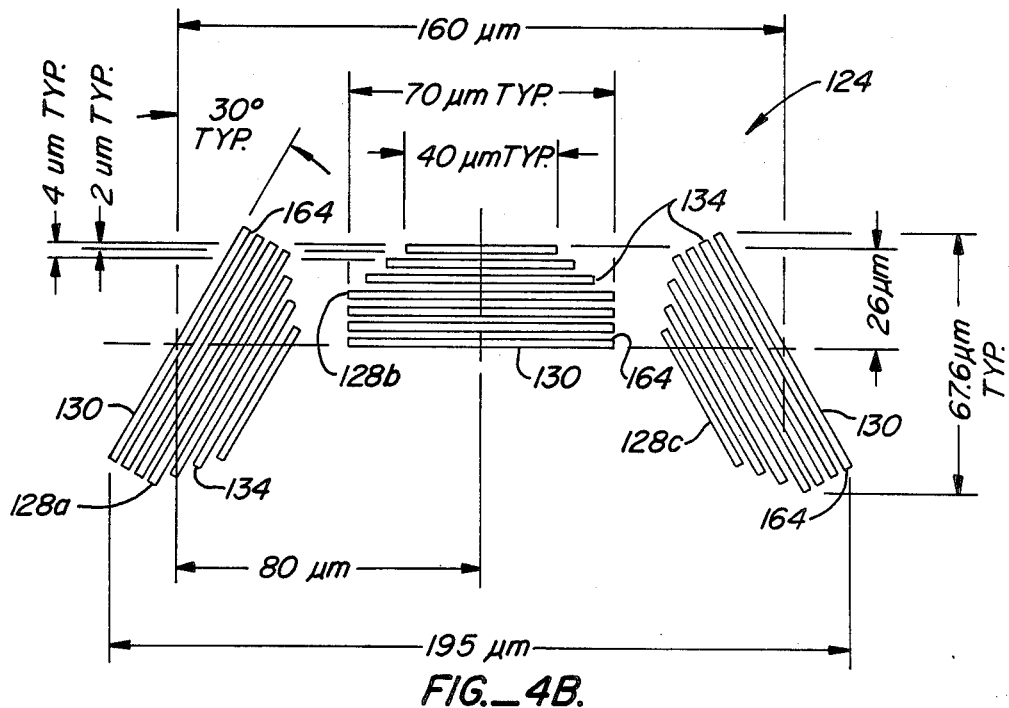
FIG._4B.
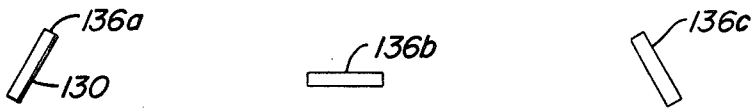
FIG._5A.
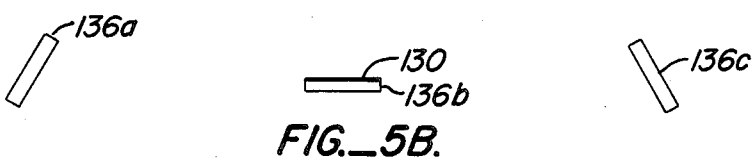
FIG._5B.
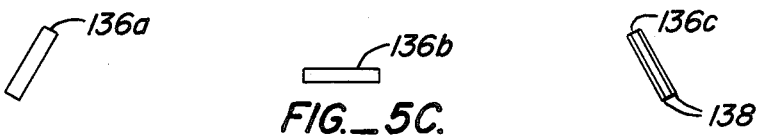
FIG._5C.

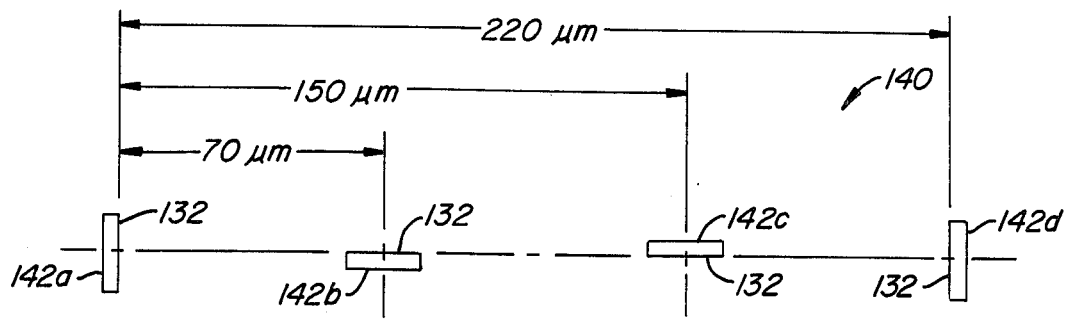
FIG._6A.
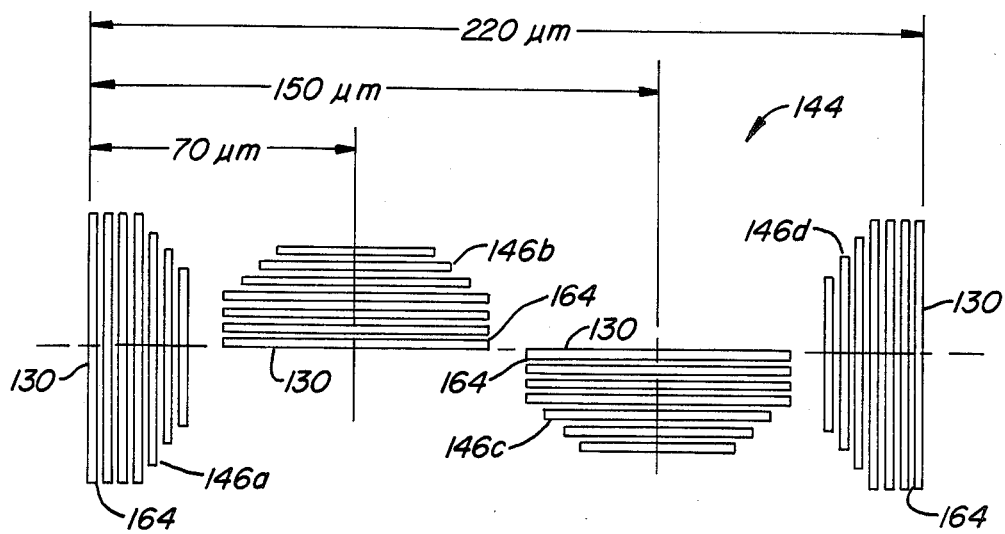
FIG._6B.
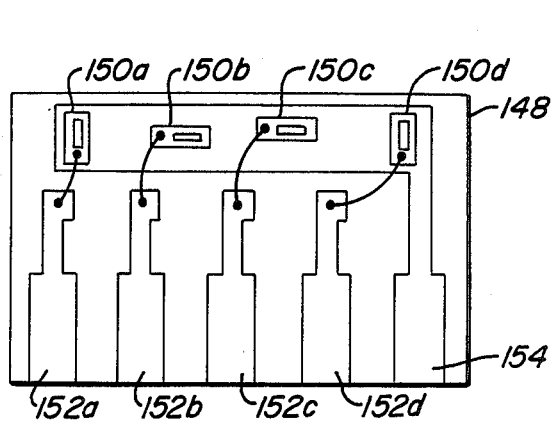
FIG._7.
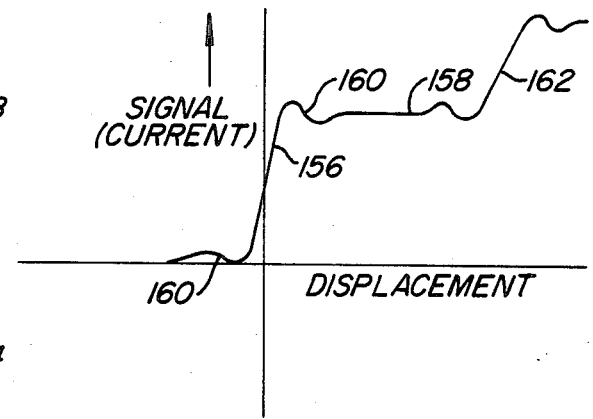
FIG._8.

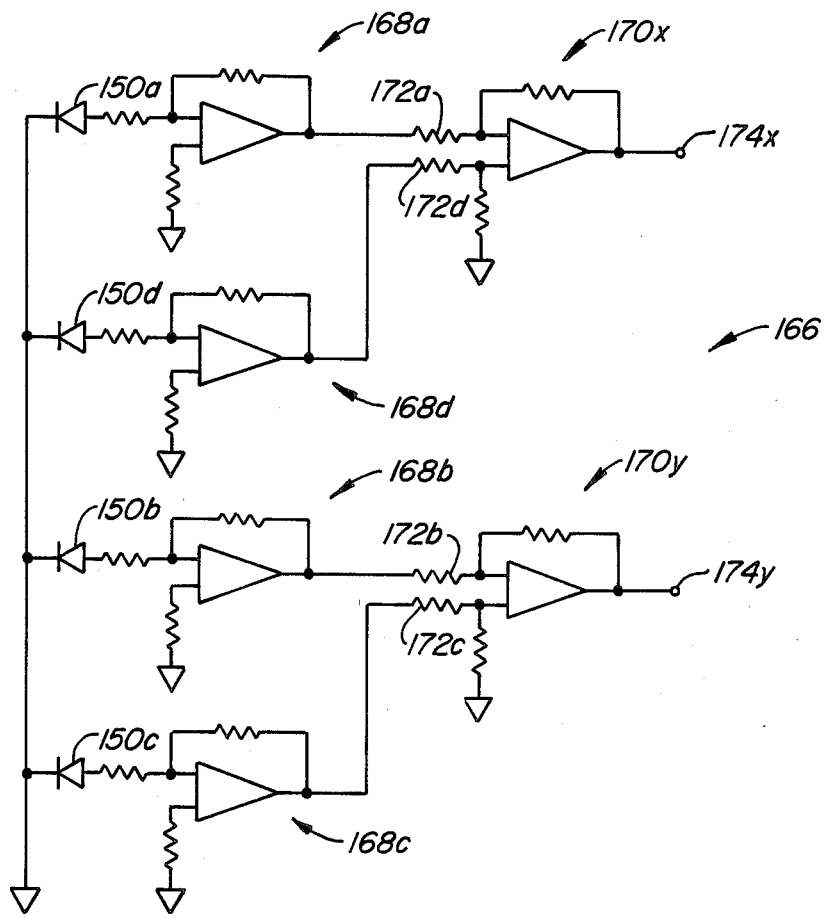
FIG._9.
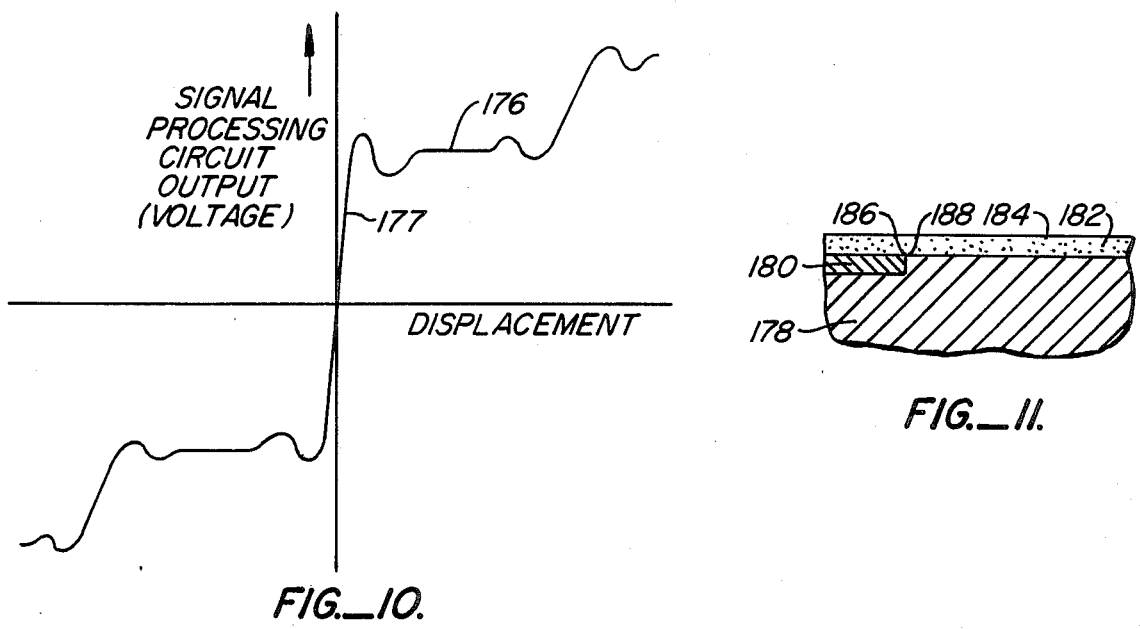
FIG._10.
FIG._11.

DARK FIELD ALIGNMENT AND ALIGNMENT MARK SYSTEMS

CROSS-REFERENCE TO RELATED PATENT APPLICATION

The subject matter of this application is related to that of copending U.S. patent application Ser. No. 695,400 entitled IMPROVED STEP-AND-REPEAT ALIGNMENT AND EXPOSURE SYSTEM AND METHOD THEREFORE and filed Jan. 28, 1985 by Edward H. Phillips, and copending U.S. patent application Ser. No. 802,772 entitled IMPROVED MULTI-AXIS GAS BEARING STAGE ASSEMBLY and filed Nov. 27, 1985 by Edward H. Phillips; and they are incorporated by reference herein.

TECHNICAL FIELD

This invention relates generally to step-and-repeat alignment and exposure systems utilizing a projection lens for printing successive layers of microcircuitry on semiconductive wafers and requiring precise layer to layer alignments. Different features of the invention make it useful when utilized in conjunction with either a projection lens of a catadioptric unit magnification type, or alternately, a projection lens of a refractive reduction type. More specifically, the invention relates to apparatus for use in such systems for achieving precise relative layer to layer alignments of the printed layers of microcircuitry.

BACKGROUND ART

In the semiconductor industry, step-and-repeat alignment and exposure systems are employed in the processing of semiconductive wafers to form integrated circuits. Very large scale integrated circuits are often fabricated by utilizing a precisely controlled stage to successively position adjacent regions containing an integral number of individual microcircuits on a semiconductive wafer with respect to an image (formed by a projection lens of the step-and-repeat alignment and exposure system) of a reticle containing a next level of microcircuitry that is then printed on the semiconductive wafer at each of those regions. This step-and repeat printing operation forms an array of adjacent regions of microcircuitry on the semiconductive wafer in rows and columns in an ordered parallel and orthogonal manner. Successive processing of the semiconductive wafer and printing of a further level of microcircuitry, aligned with the preceding processed regions to a high (sub micron) accuracy, are typically employed in the fabrication of integrated circuits from the semiconductive wafer. Successful alignment of the preceding processed regions requires the use of an alignment system that can acquire alignment information from the semiconductive wafer and use it to position the precisely controlled stage so that the semiconductive wafer is properly aligned. Most prior alignment systems feature line edge detecting techniques that are slowed in their operation by mechanical scanning, electronic scanning and/or computation time.

Various alignment systems and an alignment mark system that eliminate these causes of alignment slowing were disclosed in the aforementioned and incorporated U.S. patent application Ser. No. 695,400. These alignment systems are of both light and dark field types. The dark field alignment systems have proven to be more acceptable than the light field alignment systems. The alignment systems are limited in application to step-and-repeat alignment and exposure systems featuring catadioptric unit magnification lenses.

What is needed is a dark field alignment system comprising a modified refractive reduction lens and light source together with a microscope sub-system that enables the use of an alignment mark system such as that shown in U.S. patent application Ser. No. 695,400 in a step-and-repeat alignment and exposure system utilizing a projection lens of a refractive reduction type.

The alignment mark system, that is disclosed in U.S. patent application Ser. No. 695,400, utilizes amplitude information from light reflected from a succession of lines appearing within an illuminated area on the semiconductive wafer to provide an alignment signal. This results in an alignment mark system that features large acquisition range and provides real time amplitude and vectorial alignment information. However, the alignment mark system has been limited in its alignment accuracy because of localized variations in light intensity and diffraction characteristics of the light reflected from the alignment marks previously printed on the semiconductive wafer. These variations have resulted in limited alignment accuracy because of concomitant variations in the amount of light entering a light detector device from otherwise identical line edges.

What is needed is an improved alignment mark system which has the accuracy characteristics of a line edge detection system but maintains the large acquisition range and real time amplitude and vectorial alignment information capabilities of the alignment mark system presented in U.S. patent application Ser. No. 695,400.

SUMMARY OF THE INVENTION

A dark field alignment system is provided by the present invention wherein a bifurcated light source, including a secondary channel having spot sources of light located in a plane conjugate to the object plane of a reduction lens and directed through a peripheral ring of a plane conjugate to the aperture plane of the reduction lens, illuminates the object plane of the reduction lens. Reflected and diffracted light from an alignment mark of a semiconductive wafer, located in the image plane of the reduction lens, is captured by a mirror located near the aperture plane of the reduction lens and refocused by additional lenses onto another plane conjugate to the object plane of the reduction lens. Preferably the mirror is considered to be near the aperture plane when it is in a region wherein the ray bundles passing between object and image substantially overlay one another. The refocused light is imaged on detector arrays by a splitfield microscope to provide alignment information.

In a preferred embodiment, the secondary channel combines with a primary channel near a plane conjugate to the aperture of the projection lens.

Also, an improved alignment mark system is provided by the present invention wherein a new reticle alignment window array and wafer alignment mark are utilized in a spaced relationship such that an image of an edge of each reticle alignment window illuminates a first edge of a different one of the wafer alignment marks without illuminating any other edges of the wafer alignment marks when the semiconductive wafer is in an aligned location. In an embodiment of the present invention, that is used in conjunction with a three element detector, groups of three reticle alignment windows and three wafer alignment mark segments are utilized to align one position. In another embodiment of the present invention, that is used in conjunction with a four element detector, groups of four reticle alignment windows and four wafer alignment mark segments are utilized in sub-groups of two reticle alignment windows and two wafer alignment marks placed in a bucking relationship to align one position.

Accordingly, it is the principal object of this invention to provide a dark field alignment system that enables the use of an alignment mark system such as that shown in U.S. patent application Ser. No. 695,400 in a step-and-repeat alignment and exposure system utilizing a projection lens of a refractive reduction type.

Another object of this invention is to provide an alignment mark system which has the accuracy characteristics of an line edge detection system but maintains the large acquisition range and real time amplitude and vectorial alignment information capabilities of the alignment mark system presented in U.S. patent application Ser. No. 695,400.

BRIEF DESCRIPTION OF THE DRAWINGS

FIG. 1 is an isometric view of a dark field alignment system comprising a modified refractive reduction lens and light source together with a microscope sub-system in accordance with the preferred embodiment of the present invention.

FIG. 2 is a sectional view of the dark field alignment system of FIG. 1.

FIG. 3 is a sectional view showing the light output pattern from a fiberoptic bundle, illuminated by a light beam from an oblique angle, used in the dark field alignment system of FIG. 1.

FIG. 4 is a plan view of a reticle alignment window array, which is employed with an improved alignment mark system that is used in conjunction with a three element detector, in accordance with another preferred embodiment of the present invention.

FIG. 4B is a plan view of a wafer alignment mark, which is employed with the improved alignment mark system that is used in conjunction with the three element detector.

FIG. 5A is a plan view of a wafer alignment mark, misaligned in the X-direction, as illuminated by a projected image of the reticle alignment window array.

FIG. 5B is a plan view of a wafer alignment mark, misaligned in the Y-direction, as illuminated by a projected image of the reticle alignment window array.

FIG. 5C is a plan view of a wafer alignment mark, misaligned in the X-direction in a gross manner, as illuminated by a projected image of the reticle alignment window array.

FIG. 6A is a plan view of a reticle alignment window array, which is employed with an improved alignment mark system that is used in conjunction with a four element detector, in accordance with still another preferred embodiment of the present invention.

FIG. 6B is a plan view of a wafer alignment mark, which is employed with the improved alignment mark system that is used in conjunction with the four element detector.

FIG. 7 is a plan view of a diode array employed in the four element detector.

FIG. 8 is a graph of the current output signal of one of the diodes of the diode array of FIG. 7 with respect to a controlled motion of the stage through the region of nominal alignment of the corresponding one of wafer alignment mark segments.

FIG. 9 is a schematic diagram of a diode array signal processing circuit that is utilized to convert the current output signals of the diodes of the diode array of FIG. 7 to X-direction and Y-direction position voltage error signals.

FIG. 10 is a graph of the difference of the current output signals of a selected pair of the diodes of the diode array of FIG. 7 with respect to a controlled motion of the stage through the region of nominal alignment of the corresponding one of wafer alignment mark segments FIG. 11 is a sectional view showing a planer type of wafer line used with either of the wafer alignment marks shown in FIGS. 4B and 6B.

DESCRIPTION OF THE PREFERRED EMBODIMENTS

Referring now to FIGS. 1 and 2 there is shown an improved dark field alignment system 10 for aligning wafer alignment marks 12a and 12b on a semiconductive wafer 14 with images of alignment windows 16a and 16b, respectively, contained in an image 18 of a reticle 20 that is mounted on a reticle holder 21 and projected upon the semiconductive wafer 14 by a projection lens 22 along a first path 24a and 24b. In addition, the improved dark field alignment system 10 includes a stage assembly 26 for transporting the semiconductive wafer 14 along X-, Y- and θ-axes of motion; an illumination system 28 for providing uniform illumination to form the image 18 of the reticle 20; a light source 30 for illuminating the alignment windows 16a and 16b; and a microscope viewing section 32 for viewing conjugate images 34a and 34b of the wafer alignment marks 12a and 12b, respectively, projected by the projection lens 22 through a second path 24b and 24c to a viewing port 36.

The stage assembly 26 may comprise, for instance, the multi-axis gas bearing stage assembly disclosed in incorporated U.S. patent application Ser. No. 802,772 which includes a wafer chuck 38, an X-axis drive motor 40, and two Y-axis drive motors 42a and 42b. The wafer chuck 38 is used to support the semiconductive wafer 14. The X-axis drive motor 40 is used to position the semiconductive wafer 14 along the X-axis of motion while the two Y-axis drive motors 42a and 42b are used additively to position the semiconductive wafer 14 along the Y-axis of motion and subtractively to position the semiconductive wafer 14 along the θ-axis of motion.

The illumination system 28 comprises a Hg arc lamp 44, an elliptical reflector 46, a folding cold mirror 48, a light pipe 50, a positive lens grouping 52, a shutter 54, another positive lens grouping 56, a cold mirror 58, a negative lens grouping 60, a folding mirror 62, and yet another positive lens grouping 64. A similar illumination system was disclosed in U.S. Pat. No. 4,391,494 entitled APPARATUS FOR PROJECTING A SERIES OF IMAGES ONTO DIES OF A SEMICONDUCTOR WAFER, issued July 5, 1983 to Ronald S. Hershel and a paper entitled THE OPTICS IN THE MODEL 900 PROJECTION STEPPER which was presented at the SPIE Conference on Developments in Microlithography V, held Mar. 17-18, 1980 at San Jose, Calif. by Ronald S. Hershel and both are incorporated by reference herein. As fully described in that patent and that paper, the principal function of the light pipe 50 and the various other optical apparatus of the illumination system 28 is to fill the illuminated field of the reticle 20 with uniform light intensity of a selected wave length, such as the "G", "H" or "I" lines of Hg (436 nm, 406 nm and 365 nm, respectively) which matches the design wavelength of the projection lens 22, as hereinafter described, along paths 24d, 24e, 24f and 24g, and to selectively underfill the aperture of the projection lens 22, further along path 24a, when the shutter 54 is in its open, or exposure, position. Not described in either that patent or that paper, but none the less true is the fact that the selective underfilling of the aperture of the projection lens 22 is done in an annular manner. This is because no light is transmitted along the optic axis in this particular design as all the light comes from the elliptical reflector 46, which is itself annularly configured about the optic axis.

The light source 30 comprises a source of light such as another Hg arc lamp 66, a positive lens 68 positioned at its focal distance from the arc 69 of the Hg lamp 66, a folding cold mirror 70, a shutter 71, a bifurcated fiberoptic bundle 72, field apertures 74a and 74b in plates 76a and 76b, respectively, which are positioned in a plane 75 conjugate to the reticle 20 by servo drive units 78a and 78b, respectively, a positive lens grouping 80, another folding cold mirror 82, another positive lens grouping 84, a cold mirror 86 which also has an annular aperture 88 formed by additional opaque coatings 90 and which is positioned in a plane conjugate to the aperture of the projection lens 22, an annular reflective coating 92 formed around elliptical aperture 94 in the cold mirror 58, the negative lens grouping 60, the folding mirror 62, and the positive lens grouping 64. (For convenience, in FIG. 2 the Hg arc lamp 66 and the folding cold mirror 70 are shown rotated 90 degrees about both vertical and horizontal axes from their true positions, as shown in FIG. 1, to place those components as well as the positive lens 68 in the plane of the section drawing.)

The purpose of the light source 30 is to selectively illuminate each of the alignment windows 16a and 16b with uniform light intensity of the same selected wave length as that provided by the illumination system 28 described above, along paths 24h, 24i, 24f and 24g, and to selectively fill the outer annular portion of the aperture of the projection lens 22, further along path 24a, when the shutter 71 is in its open, or alignment, position. The positive lens 68 is coated with a cold mirror coating on one of its surfaces to reflect most of the wavelengths shorter than the selected wave length and eliminate them from entering the bifurcated fiberoptic bundle 72. Also, the cold mirror 70 passes most of the wavelengths longer than the selected wavelength out of the system and eliminates them from entering the bifurcated fiberoptic bundle 72. This filtering action relieves the bifurcated fiberoptic bundle 72 from most of the unwanted energy absorption that it would otherwise be subjected to. Further filtering of light to the selected wavelength is accomplished by the folding cold mirror 82 passing any remaining longer wavelengths out of the system and the cold mirror 86 reflecting any shorter wavelengths back toward the Hg arc lamp 66.

As can be seen in FIG. 3 (wherein the Hg arc lamp 66 and folding cold mirror 68 are shown rotated 90 degrees about both the vertical and the horizontal axes as in FIG. 2), the light passing through the positive lens 68 is collimated. After it reflects from the folding cold mirror 70 it enters the bifurcated fiberoptic bundle 72 at a selected oblique angle α. Multiple reflections within the cylindrical reflecting surfaces of each of the fibers of the bifurcated fiberoptic bundle 72 then cause the light to leave each half of the bifurcated fiberoptic bundle 72 in a cone of light 77 having the selected half angle α. The optical design of the lenses of the light source 30 is chosen so that the plane 75 is in essentially telocentric space. The selected half angle α is chosen so that light from the cone of light 77 fills the annular aperture 88. The optical design of the positive lens groupings 56 and 84, and the negative lens grouping 60, is chosen such that the annular aperture 88 and the reflective coating 92 on the cold mirror 58 are in nominally telocentric space as well, in order to compress the space required for the cold mirror 58 and to be able to position it as close to the plane of the annular aperture 88 as possible. Thus the light from the illumination system 28, which underfills the aperture of the projection lens 22, and the light from the light source 30, which fills the outer annular portion of the aperture of the projection lens 22, can pass through the same position along the path 24f by passing through the elliptical aperture 94 in the reflective coating 92 and by reflecting from the reflective coating 92, respectively.

The projection lens 22 is a large aperture (its n.a. generally being of a selected value between 0.30 and 0.45), diffraction limited lens of virtually zero distortion and field curvature. The design of such state-of-the-art lenses is made possible by restricting their operation to a single selected wavelength as called for above. Even so, such lens designs are very difficult and the resulting lenses are very complex, with as many as 17 elements present in some designs. One strategy for executing lenses of virtually zero field curvature (near totally corrected Petzval sum) was presented in a paper entitled NEW LENSES FOR MICROLITHOGRAPHY which was presented at the SPIE 1980 International Lens design Conference by Erhard Glatzel wherein Dr. Glatzel described a "double bulge" imaging ray bundle lens design. In a "double bulge" imaging ray bundle lens there is a negative lens grouping (represented in FIGS. 1 and 2 by a negative lens 96 nearest its object plane (the plane containing the reticle 20)). This is followed by a positive lens grouping (represented by positive lens 98), an aperture plane 100 (represented by a dotted circle), a strongly negative lens grouping (represented by negative lens 102), a positive lens grouping (represented by positive lens 104), and the image plane (the plane containing the image 18 of the reticle 20).

In addition to the above, the projection lens 22 also has a central zone aperture stop 106. The central zone aperture stop 106 obscurates(?) a miniature folding mirror 108 which is positioned immediately beyond the central zone aperture stop 106. The miniature folding mirror 108 defines the radial path 24c where an additional positive lens grouping 110 is positioned along the path 24c to form an image of the image 18 of the reticle 20 to define the viewing port 36, which is conjugate to the reticle 20. However, since the light passing through the aperture plane 100 from either the illuminator system 28 or the light source 30 is disposed in an annular manner around the miniature folding mirror 108, the illumination for any light reflecting from the surface of the semiconductive wafer 14 and entering the path 24c is dark field illumination. Therefore, any light present in the viewing port 36 is present because of a complex reflectance from the surface of the semiconductive wafer 14, such as that caused by an edge of a line previously printed on the semiconductive wafer 14. Alignment marks 12a and 12b on the semiconductive wafer 14, then, are imaged in the viewing port 36 as very fine lines defining the perimeter of the alignment marks 12a and 12b.

The microscope viewing section 32 comprises a splitfield microscope and light detector assembly identical to one shown in FIGS. 1, 3A, 3B and 3C of incorporated U.S. patent application Ser. No. 695,400 and described in detail in that patent application. In the microscope viewing section 36, conjugate images 34a and 34b are reimaged on light detectors 112a and 112b by lenses 114a and 114b, and 116a and 116b, respectively. (For convenience, in FIG. 2 one of the halves of the splitfield microscope and detector assembly is shown rotated 90 degrees about a vertical axis from its true position, as shown in FIG. 1, to place the component parts of that half of the splitfield microscope and detector assembly in the plane of the section drawing, and the letter suffixes on the numbers are dropped.)

When a new reticle 20 is positioned in the improved dark field alignment system 10, the stage assembly 26 is recalibrated and relocated with respect to the position of the image 18 of the reticle 20 as described in detail in incorporated U.S. patent application Ser. Nos. 695,400 and 802,772. An optical stage mark assembly 118, as particularly described in U.S. patent application Ser. No. 695,400, and the X-axis drive motor 40 and two Y-axis drive motors 42a and 42b, as described hereinabove, are used to calibrate the metrology of the stage assembly (not shown) and relocate the stage assembly 26 as required.

During alignment of the wafer alignment marks 12a and 12b on the semiconductive wafer 14, the shutter 71 is placed in its open position to illuminate the alignment windows 16a and 16b on the reticle 20. The light passing through the alignment windows 16a and 16b selectively illuminates the wafer alignment marks 12a and 12b, respectively. Line edges of the illuminated wafer alignment marks 12a and 12b are reimaged into the viewing port 36 as described hereinabove and reimaged again upon the light detectors 112a and 112b, respectively. (The alignment windows 16a and 16b, the wafer alignment marks 12a and 12b, and the light detectors 112a and 112b may comprise the diode arrays, reticle alignment window arrays, and wafer alignment marks, respectively, that are disclosed in U.S. patent application Ser. No. 695,400.) A servo control system 120 is then used in conjunction with the X-axis drive motor 40 and the two Y-axis drive motors 42a and 42b to reposition the stage assembly so that the wafer alignment marks are properly aligned with the images of the alignment windows 16a and 16b, respectively. The shutter 71 is then placed in its closed position, the shutter 54 is placed in its open position, and an exposure made with the image 18 of the reticle 20 with light from the illumination system 28.

As noted hereinbefore, an improved alignment mark system is needed wherein the improved alignment mark system has the accuracy characteristics of a line edge detection system but maintains the large acquisition range and real time amplitude and vectorial alignment information capabilities of the alignment mark system presented in U.S. patent application Ser. No. 695,400.

Referring now to FIGS. 4A and 4B, there are shown a reticle alignment window array 122 and a wafer alignment mark array 124, respectively. The reticle alignment window array 122 comprises three rectangular windows 126a, 126b and 126c (herein shown as 4 $\mu m \times 20$ $\mu m$ in size), and the wafer alignment mark 124 comprises three sets of lines 128a, 128b and 128c (herein shown as 2 $\mu m$ wide and placed on 4 $\mu m$ centers), oriented along three different axes. The orientation of the lines is chosen with respect to the layout of the three windows such that when the wafer alignment mark array 124 is properly positioned a first edge 130 of each set of the lines 128a, 128b and 128c is illuminated by a first edge 132 of the images of the windows 126a, 126b and 126c only. Each of the sets of lines 128a, 128b and 128c comprises a number of lines 134 wherein one more than half of the lines 134 beginning with the first edge 130 are of a longest length (herein shown as 70 $\mu m$ in length) and the remaining lines are progressively shorter in length (where the shortest line 134 is herein shown as 40 $\mu m$ in length). This allows the images of the three windows 126a, 126b and 126c to be grossly misaligned (herein by as much as 25 $\mu m$) without the image of any of the windows 126a, 126b or 126c overrunning their respective sets of lines 128a, 128b or 128c in any direction beyond its first edge 130. The orientation of the windows 126a, 126b and 126c and the sets of lines 128a, 128b and 128c is chosen so that they comprise nominally mutually orthogonal sets oriented at 120 degrees with respect to one another. Thus signals from the light detectors 112a and 112b can be utilized by the servo control system to reposition the stage assembly 26 as described in U.S. patent application Ser. Nos. 695,400 and 802,772. The improvement between the alignment mark system of the present invention and that described in U.S. patent application Ser. No. 695,400 being the dramatic increase in the rate of change of the resulting alignment error signal with respect to minute stage motions, expressed as a percent of the maximum alignment error signal, as described hereinbelow.

FIGS. 5A, 5B and 5C illustrate cases of misalignment of the wafer alignment mark 124 by showing the areas on the semiconductive wafer 14 illuminated by images 136a, 136b and 136c of the three windows of an alignment window 16 wherein the image 136a is on the left, the image 136b is in the center, and the image 136c is on the right. FIG. 5A illustrates a wafer alignment mark 124 misaligned in the X-direction (to the left) with a line edge 130 showing in the image 136a. FIG. 5B illustrates a wafer alignment mark 124 misaligned in the Y-direction (downward) with another line edge 130 showing in the image 136b. FIG. 5C, on the other hand, illustrates a wafer alignment mark 124 grossly misaligned in the X-direction (to the right) with two line edges 138 of any lines 134 or of two adjacent lines 134 of the set of lines 128c showing in the image 136c.

The alignment error signals presented to the servo control system 120 by either of the light detectors 112 are derived from an algebraic summation of the signals derived from the light reflected from the various areas on the semiconductive wafer 14 as illuminated by the images 136a, 136b and 136c, as described in U.S. patent application Ser. No. 695,400. Since the individual alignment error signals are highly nonlinear (as illustrated below), it may be advantageous to have an alignment window 16 and a wafer alignment mark 12 wherein the individual windows of the alignment window and the sets of lines of the wafer alignment mark are arranged in orthogonal groups of four windows and four sets of lines. Thus the resulting alignment error signals will comprise pairs of algebraic sums of two sets of individual signals that are utilized in a bucking manner.

FIGS. 6A and 6B show such a reticle alignment window array 140 comprising four windows 142a, 142b, 142c and 142d, and a wafer alignment mark array 144 comprising four sets of lines 146a, 146b, 146c and 146d, respectively, wherein each window 142a, 142b, 142c or 142d is identical in configuration to each window 126a, 126b or 126c of the reticle alignment window array 122 and each set of lines 146a, 146b, 146c or 146d is identical in configuration to each set of lines 128a, 128b or 128c of the wafer alignment mark 124. Concomitantly, a four element light detector 148 as shown in FIG. 7, can be used for each of the light detectors 112a or 112b. The four element light detector comprises an array of four photodetecting diodes 150a, 150b, 150c and 150d. Each of the photodetecting diodes 150a, 150b, 150c and 150d is rectangularly shaped and selectively sized to capture all of the light present in each reimage of each image of the windows 142a, 142b, 142c and 142d, respectively, in the image 18 of the reticle 20 on the semiconductive wafer 14. In addition, there are signal leads 152a, 152b, 152c and 152d, respectively, for each of the photosensitive diodes 150a, 150b, 150c and 150d and a single common ground lead 154.

FIG. 8 shows the individual signal (a current signal) delivered from any of the signal leads 152a, 152b, 152c or 152d as a function of minute displacement of the semiconductive wafer 14 near the aligned position. A first portion 156 of a curve 158, in FIG. 8, represents the current output of one of the photosensitive diodes 150a, 150b, 150c or 150d as the first edge 130 of the corresponding one of the sets of lines 146a, 146b, 146c or 146d moves across the image of the first edge 132 of the corresponding one of the windows 142a, 142b, 142c or 142d.

Depending on the detail character of the first edge 130, the nominally linearly sloped portion of the first portion 156 of the curve 158 may extend over a displacement range of perhaps 0.5 μm. The sidebands 160 are due to diffraction effects of the projection lens 22 as illuminated by the light source 30. The second step 162 in the curve 156 is due to a second edge 164 (shown in FIG. 6B) moving across the image of the first edge 132. The value of the curve 158 then stays constant as long as the image of that window 142a, 142b, 142c or 142d does not overrun its set of lines 146a, 146b, 146c or 146d, respectively, because the window 142a, 142b, 142c or 142d is chosen equal in width to one line plus one space (4 μm herein), and as each succeeding edge enters the image, a previous edge leaves the image. (The foregoing analysis is also applicable to the reticle window array 122 and wafer alignment mark 124 except that a three element light detector such as that shown in U.S. patent application Ser. No. 695,400 would be used.)

FIG. 9 shows a diode signal processing circuit 166 which receives the current signals from the photosensitive diodes 150a, 150b, 150c and 150d and transforms them into voltage alignment error signals for transmission to the servo control system 120. The outputs of the photodiodes 150a, 150b, 150c and 150d are coupled to current to voltage amplifiers 168a, 168b, 168c and 168d of equal amplification value, respectively. The outputs of the current to voltage amplifiers 168a and 168d are differentially coupled to an X-amplifier 170x through equally valued resistors 172a and 172d, respectively, and the outputs of the current to voltage amplifiers 168b and 168c are differentially coupled into a Y-amplifier 170y through equally valued resistors 172b and 172c, respectively. The voltage output signal of the X-amplifier 170x at junction 174x is proportional to the difference of the current outputs of the photodiodes 150a and 150d and is a real time error signal representative of the X-direction alignment of one of the wafer alignment marks 12a or 12b with the image of the alignment window 16a or 16b, respectively. The voltage output signal of the Y-amplifier 170y at junction 174y is proportional to the difference of the current outputs of the photodiodes 150b and 150c and is a real time error signal representative of the Y-direction alignment of one of the wafer alignment marks 12a or 12b with the image of the alignment window 16a or 16b, respectively. Since the rate of change of the voltage output signal on either junction 174x or 174y, with respect to minute changes in wafer alignment mark position, is very great (perhaps two orders of magnitude greater than that described in U.S. patent application Ser. No. 695,400) as is shown by a curve 176 in FIG. 10, the improved alignment mark system has the accuracy characteristics of a line edge detection system as required. Because of the real time nature of each of the voltage output signals on the junctions 174x and 174y and the extended uniform signal output signal range described above, the improved alignment mark system also maintains both the real time amplitude and vectorial alignment information capabilities, and the large acquisition range of the equivalent system described in U.S. patent application Ser. No. 695,400 as well.

In a continuing effort to improve alignment accuracies, the semiconductor industry is moving toward fabricating wafer alignment marks in a planer manner, as illustrated in FIG. 11, wherein a substrate 178 has a planer line 180 of different reflectivity than the surrounding area and is covered with a uniform layer of photoresist 182 with a flat surface 184. Such wafer alignment marks are more accurate because the uniform layer of photoresist 182 with a flat surface 184 does not refract alignment light rays. Thus no lateral shift of the semiconductive wafer relative to its apparent aligned position will be experienced and exposures of the image 18 of the reticle 20 will be more accurately placed. Since such a flat surface will reflect light in a specular manner, an edge of such a line will pass light derived from dark field illumination into the microscope viewing section 32 by diffraction effects only. Thus only the very edge of the more reflective of the substrate 178 or planer line 180 will reflect light into the microscope viewing section 32. Since this means that the width of a reflecting zone 186 or 188 is narrower than the limit of resolution of line edges in the image 18 of the reticle 20, by the projection lens 22, the slope of the line 176 in FIG. 10 is essentially determined by resolution of a line edge by the projection lens 22 and the positional extent of such a slope is in the order of perhaps 0.3 μm for such state-of-the-art projection lenses.

The improved alignment mark system can also be used with the catadioptric unit magnification step-and-repeat alignment and exposure system described in U.S. patent application Ser. No. 695,400. This is because that system has the same functional elements as the improved dark field alignment system described hereinabove, wherein these functional elements have been applied to a catadioptric unit magnification lens system.

The summation of all light level, light detection and electronic amplification errors is generally less than 10 percent. This results in an alignment accuracy of the curve 176 of FIG. 10 with respect to its correct null position of ten percent of its 0.3 μm wide slope portion 177. This, in turn, results in an alignment error of less than 0.03 μm for the improved alignment mark system as used in either the improved dark field alignment system described hereinabove, or the catadioptric unit magnification step-and-repeat alignment and exposure system described in U.S. patent application Ser. No. 695,400 with planer wafer alignment marks and uniform photoresists.

I claim:

1. Photometric printing apparatus comprising
   a holder for holding a first object;
   a stage for holding a second object;
   a projection lens, optically disposed between the holder and the stage, for projecting an image of any illuminated portion of the first object onto the second object;
   an illumination system for uniformly illuminating the entire first object;
   a light source for illuminating selected portions of the first object;
   a miniature folding mirror, located near an aperture plane of the projection lens, for sampling light reflected from the second object;
   a positive lens, located adjacent to the miniature folding mirror, for forming a viewing port in a first conjugate field plane conjugate to the first object; and
   a microscope for viewing the viewing port.

2. A photometric printing apparatus as in claim 1 wherein the illumination system and the light source are optically coupled in a first region near a first conjugate aperture plane conjugate to the aperture of the projection lens.

3. A photometric printing apparatus as in claim 2 wherein light source illuminates the selected portions of the first object through apertures located in a second conjugate field plane also conjugate to the object plane.

4. A photometric printing apparatus as in claim 3 wherein the illumination system underfills the aperture of the projection lens and concomitantly underfills the first region, the light source fills an outer annular portion of the aperture of the projection lens and concomitantly fills an outer annular portion of the first region, and said optical coupling is accomplished via passage of the light from the illumination system through an aperture in a folding mirror which couples the light from the light source concentrically around the light from the illumination system by reflecting it from the folding mirror.

5. A photometric printing apparatus as in claim 4 wherein the light from the light source is constrained to fill the outer portion of the aperture of the projection lens by an annular aperture positioned substantially in the first conjugate aperture plane.

6. A photometric printing apparatus as in claim 5 wherein the annular aperture is efficiently filled by annular conical bundles of light rays from a bifurcated fiberoptic bundle which is illuminated by a collimated beam of light located at a selected oblique angle with respect to the optical position of the annular aperture.

7. An alignment mark system comprising
   means for projecting images of a first array of windows on a first object comprising at least three windows having predetermined relative positions onto an alignment mark of a second object comprising an array of alignment patterns corresponding in number to at least the number of windows in the first array, wherein the alignment patterns have positions with respect to one another which are counterparts of the predetermined relative positions of the windows of the first array, and further wherein:
   each one of the window images of the first array has a first edge; and
   each one of the alignment patterns comprise a set of lines wherein a first line of each set of lines has a first edge corresponding in position to the first edge of corresponding window image when the array of alignment patterns is properly positioned with respect to the images of the first array of windows;
   means for detecting the light reflected from the edges of the alignment patterns which are illuminated by the images of the first array of windows; and
   means for changing the relative positions of the first and second objects until only the first edge of the first line in each one of the alignment patterns is illuminated by the first edge of the window image corresponding in position to each particular alignment pattern.

* * * * *